United States Patent [19]

Beach et al.

[11] 4,056,704
[45] Nov. 1, 1977

[54] PROCESS AND APPARATUS FOR HEATING GASES

[75] Inventors: Anthony John Beach, New Waltham; Geoffrey Frank Eveson, Tetney; Reginald Keith Leedham, Grimsby, all of England

[73] Assignee: Laporte Industries Limited, England

[21] Appl. No.: 579,635

[22] Filed: May 21, 1975

[30] Foreign Application Priority Data

June 4, 1974 United Kingdom .............. 26413/74

[51] Int. Cl.² .............................................. B23K 9/00
[52] U.S. Cl. ............................................... 219/121 P
[58] Field of Search .................. 219/383, 121 P, 75; 313/231.3, 182, 188, 191, 204, 217; 315/111.2; 423/611

[56] References Cited

U.S. PATENT DOCUMENTS

| 2,960,594 | 11/1960 | Thorpe | 219/121 P X |
|---|---|---|---|
| 2,964,679 | 12/1960 | Schneider et al. | 219/383 X |
| 3,173,388 | 3/1965 | Menrath et al. | 219/383 X |
| 3,373,306 | 3/1968 | Karlovitz | 219/121 P X |
| 3,468,632 | 9/1969 | Gunnell et al. | 219/383 X |
| 3,554,715 | 1/1971 | Bruning et al. | 219/121 P X |
| 3,585,434 | 6/1971 | Kato et al. | 219/121 P X |
| 3,597,650 | 8/1971 | Anderson et al. | 315/111.2 |
| 3,891,828 | 6/1975 | De Corso | 219/383 |

FOREIGN PATENT DOCUMENTS 1,111,411  4/1968  United Kingdom ............. 219/121 P Primary Examiner—Bruce A. Reynolds
Assistant Examiner—Fred E. Bell
Attorney, Agent, or Firm—Beveridge, DeGrandi, Kline & Lunsford

[57] ABSTRACT

The volumes of hot gas required for use in certain large scale chemical processes may be heated to e.g. above 2500° C by means of a distributed electrical discharge in an apparatus in which the supply of gas to a heating zone is through a plurality of adjacently positioned conduits arranged to constrain the gas at its point of entry thereto into a plurality of parallel streams and in which a plurality of electrodes are positioned respectively in the plurality of gas streams. If the dimensions of the conduit and of the electrodes are suitably controlled relative to the quantity of gas the distributed discharge may be maintained in the absence of seed or of a flame thus avoiding a source of contamination of the heated gas.

22 Claims, 4 Drawing Figures

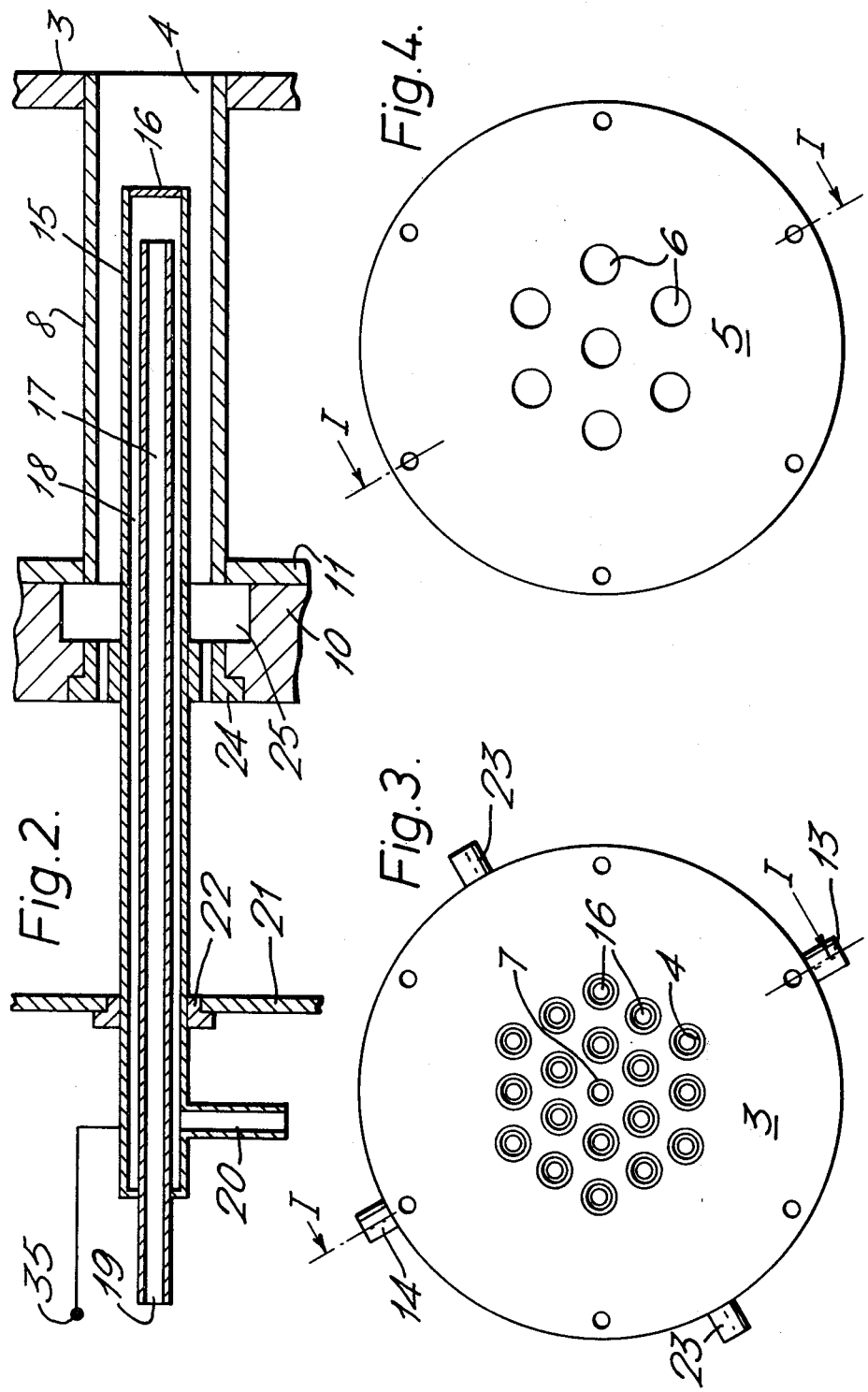

PROCESS AND APPARATUS FOR HEATING GASES

This invention relates to a process and to apparatus for heating gases.

In conducting processes based on endothermic gas phase reactions, or on insufficiently exothermix reactions, it may be necessary to supply heat to the reaction by heating one or more of the reactants, for example air or oxygen in the case of an oxidation reaction, or by conducting the reaction in the presence of an inert gas, for example nitrogen or argon, which itself is heated. An example of such a gas phase reaction is the manufacture of an oxide of an element selected from the group consisting of titanium, iron, aluminium or silicon by reacting a chloride of the element with an oxidising gas in the vapour phase to produce a gaseous suspension of solid particles of the oxide. In conducting such a process it is necessary to supply sufficient heat to raise the temperature of the mixed reactants to at least 700° C were they to be mixed without reaction occurring. If the reactants are preheated by passing through externally heated metal tubes difficulties associated with the corrosion of the metal may occur. Thus, there is a limit of about 500° C to which titanium tetrachloride may be heated in a conventional metal tubular preheater. High temperatures can be achieved by the use of preheater tubes constructed of certain noble metals, which are expensive, or of non-metallic refractory materials, which are generally fragile and tend to fracture as a result of the thermal stresses arising from extreme temperature variations.

British Pat. No. 936105 relates to a method and apparatus for the production of high gas temperatures. More particularly, it relates to the production of a stream of high temperature gas by a method which comprises creating a strongly turbulent stream of gaseous combustible mixture, forming a flame by chemical combustion in the stream and establishing a substantial electrical discharge distributed across the flame, and passing substantially all of the stream of combustion gas through the discharge to increase the temperature of said stream. By such a method gas temperatures of about 4,000° C could be reached. The electrical discharge employed in the process described in British Pat. No. 936105, which is hereafter referred to as a "distributed electrical discharge," is to be contrasted with an electrical arc discharge, which is at a low voltage and a high current and is confined within narrow filaments extending between two electrodes. In contrast, a distributed electrical discharge is a relatively high voltage, low current discharge in which the current density is substantially uniform over a relatively large proportion of the cross-sectional area of the gas stream.

British Pat. No. 111411 describes the application of a distributed electrical discharge to the preheating of gaseous reactants. In particular the British Pat. No. 111411 describes a process for the manufacture of titanium dioxide by reacting titanium tetrachloride with oxidising gas in the vapour phase, which comprises preheating the titanium tetrachloride and the oxidising gas separately, introducing the preheated titanium tetrachloride vapour and the preheated oxidising gas into a generally tubular empty reaction chamber through separate inlet means in such manner as to produce a turbulent stream of intimately mixed gases flowing along the length of the reaction chamber at a flow rate corresponding to Reynolds flow number of at least 10,000, and wherein the titanium dioxide is formed in finely divided form, introducing an inert particulate refractory material into the reaction chamber in such manner that the said particulate material impinges on the reactor surface or surfaces that are immediately adjacent to the gas inlet means and accessible to both the reactants to prevent or substantially reduce the deposition of product titanium dioxide on said surface or surfaces, substantially the whole of the said particulate material being carried out of the reaction chamber in suspension in the turbulent gas stream and thereafter separating the said particulate material from the product titanium dioxide, the titanium tetrachloride being preheated to a temperature not exceeding 500° C by heat exchange with heated metal surface and at least part of the oxidising gas being preheated at a temperature within the range from 2,500° to 3,500° C by producing a strongly turbulent stream of combustible mixture comprising the oxidising gas and a fuel gas, igniting the combustible mixture to form a flame, establishing a distributed electrical discharge across the flame, and passing substantially the whole of the combustion gas through the discharge to raise the temperature of the combustion gas, the temperature to which the titanium tetrachloride vapour is preheated and the temperature to which the oxidising gas is preheated as aforesaid being so selected from within the aforesaid ranges and the temperatures to which any other oxidising gas that is introduced into the reaction chamber is preheated being such, that, if no reaction were to take place between the titanium tetrachloride and the oxidising gas the temperature of the gaseous mixture within the reaction chamber would be at least 700° C.

Production processes in the chemical industry have tended to be carried out in larger units as the industry has developed due to competition between various producers within the industry and to the need to reduce the capital cost of a plant to the minimum per unit of output. Processes for the production of titanium dioxide by the oxidation of titanium tetrachloride are currently carried out on a scale which produces a quantity of titanium dioxide in the range of from 20,000 to 50,000 tons per annum from a single production unit. Such a scale involves the handling of extremely large quantities of gaseous reactants. For example, the quantity of oxygen required as a reactant for a process for the production of titanium dioxide, of the scale indicated above, is 2500–6250 pounds per hour.

The heating of such large quantities of gas by means of a distributed electrical discharge, applied by apparatus as disclosed either in British Pat. Nos. 1111411 or 936105 is subject to extreme difficulties. The quantity of power required to heat 2,500 pounds per hour of oxygen to a temperature of 3000° C is approximately 1,600 kilowatts. The use of a high current results in unduly high electrode wear and, besides the problem of having to close down the process to replace the electrodes, gives rise to the further problem of unwanted metal ions from the electrode which may contaminate the final product. A current of 50 amps is about the maximum which can be used on a practical basis for this reason. Within this limitation in a single gas heater, a gap of the order of thousands of centimetres would be required between the electrodes to produce the required voltage drop to generate the required amount of power. Such a gap is not really practically usable for reasons of plant design and because of an exceptionally high voltage requirement for initiating a discharge of this length. Thus the technique of using a distributed electrical discharge does not appear to have been used in commercial chemical processes, of the scale being envisaged here, despite having been known as a possibility for some fifteen years.

The present invention provides apparatus for heating gas, for example air, oxygen, nitrogen or argon, for use in, for example, a process based on a gas phase chemical reaction, comprising a heating zone, means arranged for the supply of the gas to be heated thereto, means for the removal of the heated gas therefrom, and upstream and downstream electrode means adapted for the establishment of a distributed electrical discharge in the heating zone, the means arranged for the supply of gas to the heating zone comprising a plurality of adjacently positioned conduits arranged to constrain the gas supplied to the heating zone at its point of entry thereto into a plurality of substantially parallel streams and the upstream electrode means comprising a plurality of electrodes positioned respectively in the said plurality of gas streams.

Suitably each upstream electrode is in the form of a bluff body, that is a body having a flat surface at its trailing end transverse to the direction of flow of the gas stream. Preferably each upstream electrode is positioned in its respective gas supply conduit so as to form, in combination with the conduit, a construction having the form of a bluff body flame holder. Such a construction is referred to hereafter as a bluff body upstream electrode. Suitably the downstream electrode means comprises a plate having one or more openings for the removal of gas from the heating zone therein. Preferably the plate forms the downstream wall of the heating zone.

The use of a plurality of upstream electrodes to effect a distributed electrical discharge in a single heating zone is a radical departure from the prior art. As carried into effect in the apparatus particularly described hereafter a plurality of substantially parallel discharges exist in the heating zone helping to distribute the heating effect of the discharge throughout the heating zone and to avoid large radial temperature gradients except, possibly, in the immediate vicinity of the permeable walls surrounding the heating zone, if such are used. It is found that each discharge anchors at a separate point on the downstream electrode which anchor point moves randomly over a restricted portion of the electrode surface. This acts to reduce the rate of erosion of the downstream electrode. The rate of erosion increases as the current density at the anchoring point increases and, therefore, the erosion rate would increase and the uniformity of heating of the gas would decrease if two or more discharges converged and merged at, or before, reaching the surface of the downstream electrode.

Kilham and Turner (Nature, Volume 223, No. 5210, page 1053) describe experiments using a simple tunnel burner with a central rod electrode as used by Fells, Gawen and Harker (nature-volume 210, page 1149) but in the absence of a flame. Gas flow rates for stable operation are reported by Kilham and Turner to be from 20 to 150 1/minute. Allen, Fells and Fletcher (J. Applied Physics, 1970 Volume 3, pages 628 to 631) describe experiments using a similar burner, but with air flow rates of up to 180 1/min. and in the absence of a flame. The discharge was stabilised by an axially flowing stream of air. The discharge voltage / air flow rate characteristics and the discharge voltage / electrode gap characteristics for a current of 8 amps and a given electrode gap of air flow rate are shown in FIGS. 2 and 3 of that publication. Extrapolation of the data assuming no alteration in the direction of the curves indicates that a quite impracticable discharge voltage and electrode gap would be required for an air flow rate of 2500 lbs/hr at STP. (2500 lbs/hr $\approx$ /3250 1/min.) in contrast, such large quantities of gas can be treated by the present arrangement using a relatively low current supplied to each upstream electrode and a relatively small electrode gap between the upstream and downstream electrodes.

According to a preferred feature of the present invention the heating zone is enclosed within a vessel having spaced apart, preferably parallel, upstream and downstream walls, and side walls, having in the upstream wall the plurality of gas supply conduits and in the downstream wall one or more gas removal conduits. The gas supply conduits are preferably circular cross-section tubes. The gas removal conduits need not correspond in number or positioning with the gas entry conduits. At the high gas through-put rates envisaged this arrangement may result in considerable turbulence within the heating zone and under such conditions the streams of gas entering the heating zone may quickly lose their separate identify. This does not prejudice the establishment of a diffuse electrical discharge comprising a number of diffuse discharge filaments in the heating zone.

The bluff body upstream electrodes are preferably located co-axially, and recessed, within the gas supply conduits. To avoid loss of the electrode material due to excessive temperatures the upstream and downstream electrode means are preferably cooled by the interior circulation of a coolant fluid. The bluff body upstream electrodes are preferably of circular cross-section. The tips of the bluff body electrodes conveniently take the form of cylindrical caps, having a thickness of from 10 mm to 20 mm, provided with a screw thread at one end which engages with a corresponding thread in a supporting tube to form a liquid tight seal. The corrosive effect of the electrical discharge removes metal from the flat trailing surface and this form of construction reduces the time taken to replace an eroded electrode.

The effect of erosion of the main body portion of the downstream electrode means by the discharges may be further minimised by providing on the surface of the electrode means and standing proud of or flush with the surface, replaceable anchor points constructed of a suitable metal such as copper, silver or a silver/aluminium alloy. In a preferred embodiment the anchor points are provided by annulr "spool pieces" linin the sides of the openings through the downstream electrode means. Each spool piece may be constructed in two parts each comprising an annular body adapted for fitting, as by "shrink fitting" techniques, into the openings, and an annular flange adapted to restrict the depth to which the annular body may be inserted into the opening at least the edge of the opening facing towards the upstream electrode being rebated to allow the flange to be flush with the remainder of the surface of the downstream electrode means.

The two annular body portions. are together equal to or slightly less than the depth of the downstream electrode means so that they abut axially when inserted from opposite sides of the said electrode means. A suitable solder or braze may be used to seal the joint between the two portions of the spool piece after fitting. The spool pieces are readily replaceable when eroded.

One or more discharge filaments may anchor on separate portions of each anchor point especially where there are fewer anchor points then discharge points.

The heating zone is preferably bounded by side walls which may comprise a ceraminc layer, either permeable and arranged for the passage of cooling gas inwardly through them, or of non-permeable material which may be cooled externally by a gas which is suitably the gas to be heated which may thereafter be passed to the gas supply conduits.

Suitably the walls comprise a mass of refractory ceramic fibres shaped, for example, by vacuum forming techniques. Suitable fibres are alumina or zirconia fibres available under the Trade Mark "Saffil," silica/aluminia fibres available under the Trade Mark "Fiberfrax" and "Triton Kaowool." When a non-permeable material is used for the walls the cooling gas is withdrawn at a temperature of from 100°–500° C. This helps to maintain the inner surface of the ceramic layer at a temperature no higher than 1000° C. A radiant heat shield of, for example, polished stainless steel is preferably positioned spaced outwardly from the ceramic wall with its reflecting surface facing the ceramic wall. The whole may be surrounded by a layer of insulating material preferably spaced outwardly from the radiant heat shield an a casing of, for example, mild steel.

The electrode means may be copper or other suitable conductive material such as silver or a silver/aluminium alloy.

The gas supply tubes are preferably of a corrosion resistant material such as Inconel (Inconel is a Trade Mark).

The electrical supply to the electrode means preferably has a potential in the region of 1500–3000 volts. A current of from about 10–50 amps may be passed through each of the electrodes in the upstream means, the upper limit being set up by the problem of electrode erosion. Suitably an AC power supply is used and is led through a suitable transformer to a suitable rectifier and thence to the upstream electrode. To stablilise the current a resistor may be incorporated in the circuit after the rectifier although it is preferred, in order to reduce electrical power loss, to use a choke instead of a resistor. The choke may be positioned either before the transformer or between the transformer and the rectifier.

The other electrode means is suitably earthed.

The electrode gap which may be used will depend on the potential of the electrical supply and the ionisation of the gas to be heated and the presence or otherwise of seed materials, such as, for example, potassium carbonate or cesium chloride, which ionise at relatively low temperatures. Preferably the gap is in the range of from 10–80 cm. Preferably the gas flow rate is sufficient to give a Reynolds Number of at least 10,000 in the heating zone.

When the upstream electrode is at a potential more negative than that of the downstream electrode, the electron flow is co-current with that of the stream of gas which is being heated. This arrangement is preferred. However a satisfactory discharge can be maintained when the polarities of the upstream and downstream electrode means are reversed.

The apparatus according to the present invention has a thermal efficiency (e.g. an efficiency of at least 80%) higher than that of known forms of distributed discharge heaters. The major source of thermal inefficiency is the heat conducted away from the electrode means by the coolant.

One form of apparatus in which the present invention may be carried out will now be described in detail with reference to the accompanying drawings in which the upstream electrodes are the anode and the downstream electrode is the cathode.

FIG. 2 is a vertical section on an enlarged scale of the anode/gas supply tube arrangement.

FIG. 3 is a section through the apparatus along line III — III.

FIG. 4 is a section through the apparatus along line IV — IV.

Figure 1:
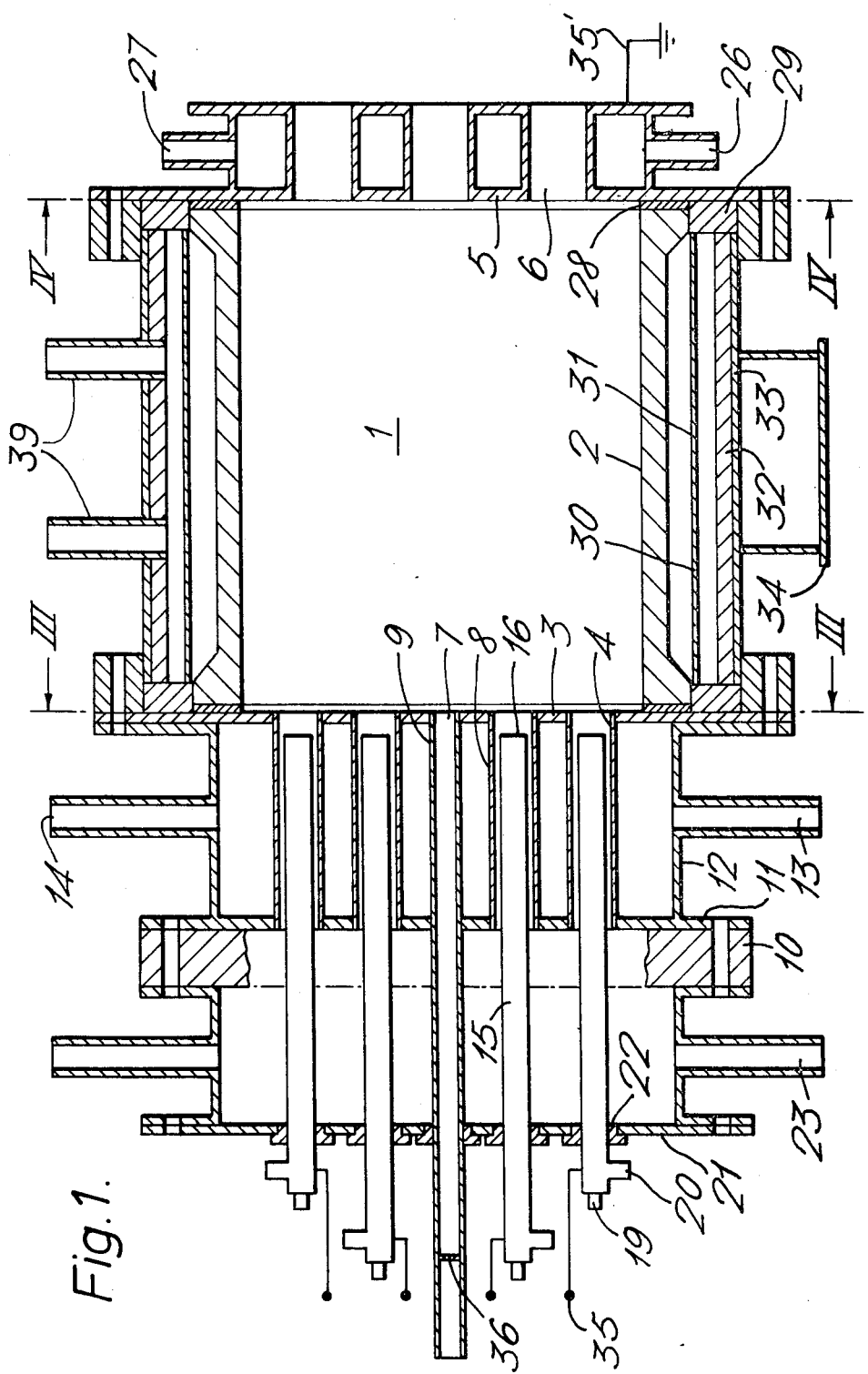
FIG. 1 is a part vertical section through the apparatus along line 1—1 of FIGS. 3 and 4.

Reffering to FIG. 1 of the accompanying drawings a heating zone 1 is enclosed by a cylindrical permeable ceramic wall 2, viewed in FIG. 1 with its axis horizontally positioned, and the end walls 3, in which the gas inlets 4 are situated, and 5, in which the gas outlets 6 are situated. The gas inlets and outlets are symmetrically distributed in their respective end walls as shown in FIGS. 3 and 4 respectively with an ignition inlet 7 centrally positioned in all 3, and provided with closure means 36.

The gas inlets 4 and ignition inlet 7 which communicate respectively with the gas supply tubes 8, and the ignition tube 9 which extends outside the heating zone 1, are made of Inconel, and are supported by a support plate 10 made of an electrically insulating ceramic material faced with a sheet 11 of Inconel. The gas supply tubes 8 and the ignition tube 9 may be cooled by coolant fluid in a jacketing 12, also made of Inconel and provided with a fluid inlet 13 and a fluid outlet 14.

Recessed within the gas inlets 4, symmetrically positioned within the gas supply tubes 8, and extending out of the gas supply tubes to the exterior of the apparatus are bluff body anodes made of copper. The anodes are cylindrical and have flat tops 16. The anodes are hollow and each is provided with means for circulating coolant fluid, comprising the interior open-topped pipe 17, the annular space 18 surrounding this and coolant fluid inlet 19 and outlet 20.

The anodes are supported by an electrically insulating ceramic plate 21 and mounted in that plate by the Inconel inserts 22. The space between the support plates 10 and 21, and surrounding the middle portions of the anodes 15, is enclosed by an Inconel jacketing which has four tubes 23 radially projecting from it equidistantly about the circumference of the jacketing. Three of these tubes are supply tubes for the gas to be heated and any additives thereto as will be described in detail hereafter. The fourth tube is closed by a bursting disc designed to be ruptured by any undue pressure rise.

The interior of the jacketed area enclosed by plates 10 and 21 communicates through channels in annular copper inserts 24 in the plate 10, which support the anodes in that plate, with spaces 25 in the plate 10 and thence with the annular spaces left in the gas supply tubes by the anodes 15. Thus the gas supplied through tube 23 may pass through the gas supply tubes 8 into the interior of the heating zone 1 through gas inlets 4.

The end wall 5 is made of copper and constitutes the cathode. It is provided with an interior space through which a coolant fluid may be circulated through the inlet 26 and the outlet 27.

The side wall 2 is heat insulated from the walls 3 and 5 by annular inserts of Kaowool (Trade Mark) 28 and supported by annular rings 29 of ceramic material. Mounted in these ceramic rings and spaced from the wall 2 is a cylindrical stainless steel heat shield 30 with its interior surface 31 polished. In turn the shield 30 is spaced from an insulating layer of Kaowool 32 which is encased by a mild steel casing 33.

In one suitable modification of the apparatus illustrated the side wall 2 is permeable and the heat shield 30 contains a number of small diameter perforations through which the cooling gas which is admitted through inlet 39 may gain access to the outer surface of the permeable wall and, under the influence of pressure, pass through the permeable wall into the heating zone. It may be possible to use merely a single mild steel casing instead of the combination of the polished stainless steel heat shield 30 the insulating layer 32 and the casing 33 where the permeable wall is made of refractory ceramic fibre and the cooling gas flow is sufficient to maintain the temperature of the permeable wall at a suitable level.

A source of AC electrical supply is connected through leads 35 to the anodes 16 through a transformer, a choke and a rectifier to produce a DC input. The cathode 5 is earthed through lead 351.

In a further modification of the apparatus illustrated a variable resistor provided on the power supply to each anode 16 may be used to adjust the electrical potential of each anode so that the current flow in each discharge is substantially the same. However, in practice, it is found that the current flows in the discharges do not differ markedly nor do they vary to any significant extent over a period of operation in the absence of such variable resistors.

While the apparatus may be positioned in any manner, that shown in FIG. 1 is provided with a support means 34 to enable it to be positioned horizontally.

To initiate the discharge, firstly, a gaseous fuel/oxidising gas mixture is supplied to the annular space surrounding the upstream electrodes 15 through a tube 23, and the annular channels in inserts 24, and is ignited through the ignition tube 9 to form a flame at the mouth of each gas inlet 4. The closure means 36 is shut. The flames anchor on the tops of the upstream electrodes 16 which act as bluff body flame holders. A suitable hydrocarbon fuel is propane, or town gas, and a suitable oxidising gas is air. Some oxidising gas combinations, for example, a propane/oxygen combination may be hazardous and are preferably avoided. Secondly, a suitable seed material in aerosol form is supplied through a tube 23. Thirdly, a distributed discharged is initiated by applying a suitable potential to the anodes 16.

The voltage required to initiate the discharge will be higher than that needed to maintain it. In a seeded flame system as described above and having an electron concentration of at least $10^{14}/cm^3$ the initiation voltage may be estimated by the equation:

$$Vi = 28.57 \text{ (electrode gap cm)} + 460$$

for an electrode gap in the region of 10–80 cm. Alternatively a lower initiation voltage may be used in combination with other means such as magnesium ribbons burning in the heating zone to increase ionisation, or intermediate electrodes.

If the heating is to be conducted in the absence of a flame and/or in the absence of seed material the feed of the gaseous fuel and/or the seed material may be discontinued after the discharge has been initiated and then, if the gas to be heated is not the oxidising gas, it may be fed, in place of the oxidising gas, through a tube 23. To maintain a distributed discharge in the absence of a flame and/or of seed material other limitations may have to be imposed on the operation of the process, as hereafter described.

The process may be operated at atmospheric pressure or under a positive pressure, for example a pressure of about 50 p.s.i.g. or under a negative pressure, for example, a pressure of about 10 p.s.i.a.

A flame results in combustion products which mix with the gas being heated and with the reactants in any process for which that gas is intended. In particular processes such as, for example, the manufacture of titanium dioxide by the oxidation of titanium tetrachloride, this may be undesirable. From the point of view of the chemical process for which the gas is being heated the seed material may also represent an undesirable impurity. This again is true of a process for the manufacture of titanium dioxide. A small amount of work has been done on the establishment of distributed electrical discharges in the absence of flames. For example, Kilham and Turner (Nature, Volume 223, No. 5210, page 1053) using an AC electrical discharge and a potassium carbonate seed material found it possible to establish a diffuse electrical discharge in air, which discharge was stable over a wide range of flow rates. Diffuse discharges were subsequently established in nitrogen, oxygen and argon, in the presence of seed material, by cutting off the fuel supply to an augmented propane/air flame and gradually replacing the air by the gas to be heated. Again a seed material and AC power was used. Later Allen, Fells and Fletcher (Journal of Applied Physics 1970, Volume 3 pages 628 to 631) found it possible to establish a diffuse electrical discharge in air using DC power in the absence of the seed material. The establishment of a diffuse electrical discharge is facilitated by the presence of NO (nitric oxide) which forms under discharge conditions by reaction between nitrogen and oxygen present in air. This may explain the success of Allen, Fells and Fletcher in establishing a diffuse electrical discharge in air in the absence of flame or seed material. Pure oxygen, which is required to be preheated for many industrial processes in which it is utilised, contains a few ions and lends itself to a lesser degree than air to the establishment of a diffuse electrical discharge.

We have now found that it is possible to maintain a stable diffuse electrical discharge, in the absence of seed and flame, in a stream of pure oxygen provided that certain parameters are carefully controlled. In contrast to the findings of Kilham and Turner and of Allen, Fells and Fletcher who found it possible to use a very wide range of gas flow rate, we find that the oxygen flow rate must be carefully controlled in relation to the dimensions of the apparatus being used.

In the case where the upstream electrode is in the form of a cooled bluff body flame holder co-axially positioned in a gas supply tube and having a flat head recessed within the tube by a short distance from the opening thereof into the heating zone the limitations expressed hereafter must be observed.

The following symbols are used:

$D1$ = the cross-sectional diameter in inches of the head of the bluff body upstream electrode.

$D2$ = the cross-sectional diameter of the opening of the gas supply tube in inches.

$D3$ = the depth in inches in an axial direction by which the head of the bluff body upstream electrode is recessed within the gas supply tube from the opening thereof.
M = mass of gas to be heated in lb/hr.
X = π/4 ($D_2^2 - D_1^2$)
Y = π/4 ($D_2^2$)

The limitations are:

$$M/X = 97.2 \pm 22.0 \quad (1)$$

$$M/Y = 45.8 \pm 8.5 \quad (2)$$

While the head of the anode is preferably recessed within the gas supply tube, it may be level with the gas supply tube opening but may not protrude therefrom. The position of the head of the upstream electrode may be made adjustable by suitable means operable from outside the body of the heater unit.

Preferably D3 is greater than D1 ad less than D2.

If limitations (1) and (2) are suitably observed it is possible to maintain a diffuse electrical discharge in pure oxygen or other pure gases containing few or no ions, in the absence of seed and in the absence of flame and using DC power and a potential drop between upstream and downstream electrode means of up to 700 volts.

If it is desired to work at a greater potential drop than 700 volts, of if it is desired to use AC current, seed would be required to be added continuously to the stream of oxidising gas.

The diffuse electrical discharge obtained when observing the above limitations is sufficiently stable to enable the use of the apparatus, comprising a plurality of bluff body upstream electrodes and a heating zone, provided by this invention and described above. Such a combination of process parameters and apparatus is particularly efficacious in heating pure oxygen in the quantities required for modern large scale plants for the manufacture of metal oxides by the oxidation of a chloride of a metal selected from titanium, iron, aluminum, silicon and zirconium in the vapor phase, in the general manner disclosed in British Pat. No. 1111411. The heated oxygen may be at too high a temperature for such use as it leaves the apparatus but may be mixed with cold gas, i.e. cold oxygen, to bring it to a suitable temperature before being mixed with the chloride vapour which itself may or may not be preheated to a temperature substantially above the boiling point of the liquid chloride. Particularly suitably the heated oxygen is used for the vapour phase oxidation of titanium tetrachloride.

We claim:

1. Apparatus for heating gas comprising means defining a heating zone; gas supply means for applying gas to said heating zone to be heated therein; gas removal means for removing heated gas from said heating zone; upstream and downstream electrode means adapted to establish a distributed electrical discharge in said heating zone; and means for establishing a difference in electrical potential between said upstream and downstream electrical means, said gas supply means comprising a plurality of adjacently positioned conduits arranged to constrain the gas supplied to said heating zone at its point of entry thereto into a plurality of substantially parallel streams; and the upstream electrode means comprising a plurality of electrode members positioned respectively in said plurality of gas streams.

2. Apparatus as claimed in claim 1 wherein the means defining the heating zone comprises a vessel having parallel spaced apart upstream and downstream walls, and side walls, the gas supply means conduits pass through the upstream wall and the gas removal means comprise one or more openings positioned in the downstream wall.

3. Apparatus as claimed in claim 1 in which each of the upstresm electrodes includes at the trailing end thereof a flat surface transverse to the direction of gas flow and is positioned in its respective gas supply conduit to form, in combination with the conduit, a bluff body flame holder.

4. Apparatus as claimed in claim 3 in which the dimemsions of the bluff body flame holder and the quantity of gas have a relationship within the ranges:

$$M/X = 97.2 \pm 22.0$$

$$M/Y = 45.8 \pm 8.5$$

where
M is the mass of gas in lb/hr.
X has the value π/4 ($D_2^2 - D_1^2$)
Y has the value π/4 ($D_2^2$)
$D_1$ is the cross-sectional diameter in inches of the head of the bluff body upstream electrode,
$D_2$ is the cross-sectional diameter in inches of the opening of the gas supply conduit.

5. Apparatus as claimed in claim 1 in which the upstream and downstream electrode means includes hollow members provided internally with cooling means.

6. Apparatus as claimed in claim 1 in which the upstream electrodes are cylindrical in cross-section and have replaceable tips.

7. Apparatus as claimed in claim 1 in which the downstream electrode means comprises a plate forming the downstream wall of the heating zone.

8. Apparatus as claimed in claim 7 in which the gas removal means comprises at least one opening through said plate for the passage of gas therethrough.

9. Apparatus as claimed in claim 1 in which the gas removal comprises a single opening in the downstream electrode means.

10. Apparatus as claimed in claim 1 in which the discharge surfaces of the upstream and downstream electrodes are made of copper, silver or a silver-/aluminium alloy.

11. Apparatus as claimed in claim 1 in which the side walls of the vessel are made of a permeable material.

12. Apparatus as claimed in claim 11 wherein the permeable material is a refractory ceramic material.

13. Apparatus as claimed in claim 1 in which the gap between the upstream and downstream electrode means is from 10 to 80 cm in length.

14. Apparatus as claimed in claim 1 in which the means for establishing a difference in electrical potential is capable of providing a current of from 10 to 50 amperes to each upstream electrode and a potential drop of from 1500 to 3000 volts across said upstream and downstream electrode means.

15. Apparatus as claimed in claim 1 in which the gas supply means supplies gas at sufficient velocity to give a Reynolds number of at least 10,000 in the heating zone.

16. Apparatus as claimed in claim 1 in which each of said plurality of electrode members is recessed within a respective conduit and includes a circularly cross-sectioned flat trailing end positioned transversely with respect to the direction of flow of a stream of gas in that conduit and within the said stream, the cross-sectional diameter of the conduit being greater than the depth by which the elecrode end is recessed within the conduit, and the said depth being greater than the cross-sectional diameter of the electrode end.

17. A process for heating gas comprising the steps of, introducing the gas to a heating zone at the upstream end thereof in a plurality of substantially separated, parallel streams,
providing an electrode in each of said streams at said upstream end,
providing a downstream electrode means at the downstream end of said heating zone,
establishing a distributed electrical discharge between said upstream electrodes and said downstream electrode means, and
removing the heated gas from said heaing zone.

18. A process as claimed in claim 17 wherein said heating zone is enclosed within a vessel having parallel spaced apart upstream and downstream walls, and side walls, said gas being introduced through conduits positioned in said upstream wall, and being removed through one or more openings positioned in said downstream wall, each of said upstream electrodes being positioned in a conduit and having at its trailing end a flat surface transverse to the direction of gas flow so as to form in combination with the conduit a bluff body flame holder, and wherein the dimensions of said bluff body flame holder and the quantity of said gas introduced have a relationship within the ranges:

$$M/X = 97.2 \pm 22.0$$

$$M/Y = 45.8 \pm 8.5$$

where
$M$ is the mass of gas in lb/hr.
$X$ has the value $\pi/4$ $(D_2^2 - D_1^2)$
$Y$ has the value $\pi/4$ $(D_2^2)$
$D_1$ is the cross-sectional diameter in inches of the head of the bluff body upstream electrode
$D_2$ is the cross-sectional diameter in inches of the opening of the gas supply tube.

19. A process as claimed in claim 18 wherein the value of $D_3$ is greater than that of $D_1$ and less than that of $D_2$ where $D_3$ is the depth in inches in an axial direction by which the head of the bluff body upstream electrode is recessed within the gas supply tube from the opening thereof.

20. A process as claimed in claim 18 wherein the gas to be heated is pure oxygen.

21. A process as claimed in claim 20 wherein the heated oxygen is used to oxidise a chloride of a metal selected from titanium, iron, aluminium, silicon and zirconium in the vapour phase to produce a gaseous suspension of the corresponding oxide.

22. A process as claimed in claim 21 wherein the oxygen is heated, after initiation of the discharge, in the absence of seed and of a flame, using DC power and a potential drop between upstream and downstream electrodes of up to 700 volts.

* * * * *

UNITED STATES PATENT OFFICE
CERTIFICATE OF CORRECTION

Patent No. 4,056,704  Dated November 1, 1977

Inventor(s) ANTHONY JOHN BEACH, ET AL.

It is certified that error appears in the above-identified patent and that said Letters Patent are hereby corrected as shown below:

On the title page, under "Foreign Application Priority Data" correct the date of the priority document from "June 4, 1974" to read --June 14, 1974--.

| | |
|---|---|
| Col. 1, lines 56 and 59, | "111411" should read --1111411-- |
| Col. 3, line 59, | "nature" should read --Nature-- |
| Col. 4, line 51 | Correct the spelling of "annular" and "lining" |
| Col. 9, line 18, | Correct the spelling of "and" |
| Col. 9, line 53, | Delete "applying" and substitute --supplying-- |
| Col. 9, line 60, | Delete "electrical" and substitute --electrode--. |

Signed and Sealed this

Second Day of May 1978

[SEAL]

Attest:

RUTH C. MASON
Attesting Officer

LUTRELLE F. PARKER
Acting Commissioner of Patents and Trademarks